US012305111B2

(12) United States Patent
Short et al.

(10) Patent No.: US 12,305,111 B2
(45) Date of Patent: May 20, 2025

(54) ORGANIC HEAT TRANSFER SYSTEM, METHOD AND FLUID

(71) Applicant: The Lubrizol Corporation, Wickliffe, OH (US)

(72) Inventors: Amy L. Short, Lakewood, OH (US); Alexander Sammut, Chardon, OH (US); Douglas T. Jayne, Novelty, OH (US); Ryan Ritz, King of Prussia, PA (US)

(73) Assignee: The Lubrizol Corporation, Wickliffe, OH (US)

( * ) Notice: Subject to any disclaimer, the term of this patent is extended or adjusted under 35 U.S.C. 154(b) by 714 days.

(21) Appl. No.: 17/617,996

(22) PCT Filed: Jun. 12, 2020

(86) PCT No.: PCT/US2020/037392
§ 371 (c)(1),
(2) Date: Dec. 10, 2021

(87) PCT Pub. No.: WO2020/252235
PCT Pub. Date: Dec. 17, 2020

(65) Prior Publication Data
US 2022/0259476 A1 Aug. 18, 2022

Related U.S. Application Data

(60) Provisional application No. 62/860,441, filed on Jun. 12, 2019.

(51) Int. Cl.
*C09K 5/10* (2006.01)
*H01M 10/613* (2014.01)
*H01M 10/625* (2014.01)
*H01M 10/6567* (2014.01)
*H05K 7/20* (2006.01)

(52) U.S. Cl.
CPC ............ *C09K 5/10* (2013.01); *H01M 10/613* (2015.04); *H01M 10/625* (2015.04); *H01M 10/6567* (2015.04); *H05K 7/20236* (2013.01); *H01M 2220/20* (2013.01)

(58) Field of Classification Search
None
See application file for complete search history.

(56) References Cited

U.S. PATENT DOCUMENTS

| | | | |
|---|---|---|---|
| 508,654 A | 11/1893 | Thomson | |
| 637,773 A | 11/1899 | Fleming | |
| 6,309,774 B1 | 10/2001 | Buchner et al. | |
| 9,051,502 B2 | 6/2015 | Sedarous et al. | |
| 9,774,065 B2 | 9/2017 | Deng et al. | |
| 11,390,789 B2 | 7/2022 | Lacroix et al. | |
| 2002/0139962 A1 | 10/2002 | Fefer et al. | |
| 2004/0110050 A1 | 6/2004 | Abd Elhamid et al. | |
| 2007/0069188 A1 | 3/2007 | Takei et al. | |
| 2007/0208205 A1 | 9/2007 | Baba et al. | |
| 2009/0036337 A1 | 2/2009 | Deskin et al. | |
| 2009/0260777 A1 | 10/2009 | Attlesey | |
| 2012/0264661 A1 † | 10/2012 | Tsubouchi | |
| 2012/0283162 A1 | 11/2012 | Tsubouchi et al. | |
| 2013/0285781 A1 | 10/2013 | Yin | |
| 2014/0131635 A1 | 5/2014 | Sunkara et al. | |
| 2015/0158958 A1 | 6/2015 | Harrington et al. | |
| 2015/0319889 A1 | 11/2015 | Flory et al. | |
| 2016/0042830 A1 | 2/2016 | Ohno | |
| 2017/0162923 A1 | 6/2017 | Deng et al. | |
| 2018/0048037 A1 | 2/2018 | Newman | |
| 2018/0084670 A1 | 3/2018 | Hirai et al. | |
| 2018/0100118 A1 | 4/2018 | Flores-Torres et al. | |
| 2018/0142178 A1* | 5/2018 | Housel | C10M 105/38 |
| 2018/0316074 A1 | 11/2018 | Kreisel et al. | |
| 2020/0062674 A1* | 2/2020 | Cao | C10G 69/06 |
| 2020/0199430 A1 | 6/2020 | Dance et al. | |
| 2020/0248095 A1 † | 8/2020 | Guerin | |
| 2021/0139805 A1 | 5/2021 | Champagne | |
| 2022/0131205 A1* | 4/2022 | Champagne | H01M 10/36 |

FOREIGN PATENT DOCUMENTS

| | | |
|---|---|---|
| CA | 2299516 | 8/2000 |
| CN | 203882259 | 10/2014 |
| DE | 202005002390 | 6/2005 |
| EP | 2770512 | 8/2014 |
| EP | 2809138 | 12/2014 |
| EP | 3188580 | 7/2017 |

(Continued)

OTHER PUBLICATIONS

ASTM International, Standard Test Method for Flash Point by Tag Closed Cup Tester, ASTM Designation D8 56-05, 2005.
INEOS Oligomers, Durasyn Polyalphaolefin (PAO) Typical Properties, Grades at a Glance, Jan. 2018.
"AeroShell Fluid 602", Technical Data Sheet, Aug. 21, 2014.
"Castrol Brayco Micronic 889", Product Data Sheet, Jun. 30, 2009, pp. 1-3, Version 1, Castrol Industrial North America, Inc., Naperville, IL.
Cargill, Incorporated, "Envirotemp™ 200 Fluid The Synthetic Ester Solution", 2014, Product Brochure.
Engineered Fluids, The SLIC Primer for Bit Miners (Single-Phase, Liquid Immersion Cooling), Oct. 23, 2018, pp. 1-68, Engineered Fluids, LLC, Tyler, TX.

(Continued)

*Primary Examiner* — Wyatt P McConnell
(74) *Attorney, Agent, or Firm* — Christopher P. Demas; Michael A. Miller

(57) ABSTRACT

The disclosed technology relates to a heat transfer system and heat transfer method employing a dielectric oleaginous heat transfer fluid. In particular, the technology relates to a dielectric oleaginous heat transfer fluid with low electrical conductivity, low flammability, and low freeze point that provides excellent peak temperature reduction in a heat transfer system, such as that for cooling a power system of an electric vehicles.

16 Claims, No Drawings

(56) References Cited

FOREIGN PATENT DOCUMENTS

| | | |
|---|---|---|
| EP | 3315590 | 5/2018 |
| EP | 3352177 | 7/2018 |
| EP | 3422834 | 1/2019 |
| EP | 3422835 | 1/2019 |
| EP | 3816261 | 5/2021 |
| FR | 3062522 | 8/2018 |
| FR | 3068448 | 1/2019 |
| FR | 3093729 † | 9/2020 |
| JP | H06-124733 | 5/1994 |
| JP | 2005-317259 | 11/2005 |
| JP | 2011-157542 A2 | 8/2011 |
| JP | 2011201953 | 10/2011 |
| JP | 2013-43933 | 3/2013 |
| WO | 9722572 | 6/1997 |
| WO | 2006136594 | 12/2006 |
| WO | WO2007137018 A1 | 11/2007 |
| WO | 2008054873 | 5/2008 |
| WO | 2009066518 | 5/2009 |
| WO | 2009071608 | 6/2009 |
| WO | 2010053689 | 5/2010 |
| WO | 2011113851 | 9/2011 |
| WO | 2012173674 | 12/2012 |
| WO | 2013019336 | 2/2013 |
| WO | 2014116370 | 7/2014 |
| WO | 2014128227 | 8/2014 |
| WO | 2014157217 | 10/2014 |
| WO | 2015099907 | 7/2015 |
| WO | 2015/142887 | 9/2015 |
| WO | WO-2015142887 A1 * | 9/2015 ............... C08K 5/01 |
| WO | 2017004078 | 1/2017 |
| WO | 2017173420 | 10/2017 |
| WO | 2018078024 | 5/2018 |
| WO | 2019051363 | 3/2019 |
| WO | 2019051391 | 3/2019 |
| WO | 2019/077105 | 4/2019 |
| WO | 2019183213 | 9/2019 |
| WO | 2020007853 | 1/2020 |
| WO | 2020007954 | 1/2020 |
| WO | 2020007955 | 1/2020 |
| WO | 2020182718 | 9/2020 |
| WO | 2020216690 | 10/2020 |

OTHER PUBLICATIONS

Petro-Canada, Luminol® High-Efficiency Electrical Insulating Fluids, pp. 1-2, Petro-Canada Lubricants Inc., Mississauga, Ontario.
Green Car Congress, "American Refining Group Taking ⅓ Stake in Amyris/Cosan Novvi JV", Jul. 19, 2016, pp. 1-11, www.greencarcongress.com.
Nynas, "Nynas Transformer Oil—Nytro 10 GBN", May 15, 2006, Product Data Sheet.
DSI, "OptiCool-87252 Fluid Safety Data Sheet", Aug. 2017, pp. 1-12, DSI Ventures, Inc.
Wikipedia, "Transformer Oil", Jan. 18, 2019, https://en.wikipedia.org/wiki/transformer oil.
Edited by Martinez-Vega, Juan, "Dielectric Materials for Electrical Engineering", Insulating Oils for Transformers, Chapter 16, pp. 1-31, ISTE Ltd. and John Wiley & Sons, Inc. in 2010 in Great Britain and United States, Hermes Science/Lavoisier in 2007 in France.
Bharat Heavy Electricals Limited, "Transformers", 2005, Chapter 3, pp. 40-45, McGraw-Hill, New York, NY.
NEOS Oligomers, Grades at a Glance, Durasyn Polyalphaolefins, Jan. 2018.
INEOS Oligomers, Grades at a Glance, Durasyn Polyalphaolefins, Jan. 2018.
Standard Test Method for Flash Point by Tag Closed Cup Tester, Designation: D 56-05, ASTM International, May 2005.
3M, 3M Immersion Cooling, The Next Generation of Data Centers is here, Electronic Materials Solution Division, 2019.
Engineered Fluids, LLC, AmpCool® Dielectric Coolants, Product Sheet, Dec. 1, 2017.
APL Automobil-Prüftechnik Landau GMBH, Test Report, Oil Analysis, Landau, Germany, Jul. 25, 2023.
APL Automobil-Prüftechnik Landau GMBH, Test Report, Oil Analysis, Landau, Germany, Sep. 8, 2023.
Ashland, Safety Data Sheet, Ceraphyl™ SLK Ester, Nov. 23, 2018.
ASTM International, Standard Test Method for Flash Point by Tag Closed Cup Tester, ASTM Designation D56-16, Jun. 2016, West Conshohocken, PA.
ASTM International, Standard Test Method for Flash Point by Tag Closed Cup Tester, ASTM Designation D56-16A, Jul. 26, 2021, astm.org/d0056-16a.html.
ASTM International, Standard Test Method for Flash Point by Tag Closed Cup Tester, ASTM Designation D56-21a, Jul. 26, 2022, West Conshohocken, PA.
ASTM International, Standard Test Method for Kinematic Viscosity of Transparent and Opaque Liquids (and Calculation of Dynamic Viscosity), ASTM Designation D445-21, Dec. 20, 2021.
ASTM International, Standard Test Method for Dissipation Factor (or Power Factor) and Relative Permittivity (Dielectric Constant) of Electrical Insulating Liquids, ASTM Designation D924-15, Nov. 2015.
ASTM International, Standard Specification for Mineral Insulating Oil Used in Electrical Apparatus, ASTM Designation D3487-00, Jan. 2001.
ASTM International, Standard Specification for Mineral Insulating Oil Used in Electrical Apparatus, ASTM Designation D3487-16, Jul. 2016.
ASTM International, Standard Test Method for Pour Point of Petroleum Products (Rotational Method), ASTM Designation D5985-02(2020), Jun. 9, 2020, www.astm.org/d5985-02r20.html.
ASTM International, Precision and Equivalence of Automatic and Manual Flash Point Apparatus, Jan. 1, 2002, vol. 30, Issue 1, www.astm.org/jte12291j.html.
Nadkarni, Kishore, R.A., Guide to ASTM Test Methods for the Analysis of Petroleum Products and Lubricants, ASTM Manual Series, Stock No. MNL44, 2000, Millennium Analytics, Inc., East Brunswick, NJ.
Basf, Petrochemicals Plasticizers, Pastomoll® DOA Technical Information Sheet, Jun. 2019, pp. 1-4, Houston, TX.
Boogaard, Peter J., et al., Toxicological and Ecotoxicological Properties of Gas-to-Liquid (GTL) Products. 1. Mammalanlian Toxicology, Critical Reviews in Toxicology, Aug. 25, 2016, vol. 47, No. 2, pp. 121-144, Informa UK Limited, trading as Taylor & Francis Group, United Kingdom.
Castrol, Bryco Micronic 889, Safety Data Sheet, Aug. 3, 2015, Naperville, IL.
Castrol, Perfecto™ TR UN Transformer Oil, Product Data Sheet, Jul. 3, 2015, Reading, United Kingdom.
Chevron, Chevron Paramount Process Oil, Material Safety Data Sheet, Mar. 16, 2006, San Ramon, CA.
Chevron Phillips Chemical, Soltrol® 220 Isoparaffin Solvent, Safety Data Sheet, Jul. 15, 2022, Version 1.6, The Woodlands, TX.
Field, Kyle, Xing Mobility Introduces Immersion Cooled Modular Battery Pack System, May 7, 2019, CleanTechnica, https://cleantechnica.com.
Conrad, Andreas, et al., Low-Temperature Rheology and Thermoanalytical Investigation of Lubricating Oils: Comparison of Phase Transition, Viscosity, and Pour Point, Oct. 6, 2021, MDPI, Journal Lubricants, https://doi.org/10.3390/lubricants9100099.
Cross L-40 Process Oil, Product Data Sheet, Oct. 2012, Cross Oil Refining & Marketing, Inc., Smackover, AR.
UCON™ OSP Fluids A Breakthrough in Oil-Soluble PAG Lubricant Technology, 2019, The Dow Chemical Company.
Goldstein, Brian, Solving Today's Lubricant Challenges with Ucon™ OSP, Presentation, The Dow Chemical Company.
DSI Ventures, Choosing the Right Fluid for Electronics Cooling: Seven Dimensions of a Decision: An Aid for Thermal Engineers, 2013, DSI Ventures, Inc.
DSI Ventures, Dielectric Fluids vs. Mineral Oils in Motor Cooling Applications, 2016, DSI Ventures, Inc.

(56) References Cited

OTHER PUBLICATIONS

DSI Ventures, Efficient Electrical Cooling with OptiCool Fluid, 2008, DSI Ventures, Inc.
DSI Ventures, Opticool Fluids Application and Handling Guide, Aug. 4, 2014, DSI Ventures, Inc.
DSI Ventures, OptiCool Fluids Specialty Heat Transfer Products, 2016, DSI Ventures, Inc.
DSI Ventures, OptiCool-87252 Fluid Safety Data Sheet, Aug. 14, 2017, DSI Ventures, Inc.
DSI Ventures, OptiCool—A Fluid Safety Data Sheet, Aug. 1, 2017, DSI Ventures, Inc., Tyler, TX.
DSI Ventures, Opticool-MIL Fluid, 2017, DSI Ventures, Inc., https://web.archive.org/web/20170520224821/http://dsiventures.com/electronics-cooling/opticool-mil-fluid/.
Dsi Ventures, Opticool-MIL Fluid, Synthetic Heat Transfer and Insulating Fluid for Military and Aerospace Equipment, 2016, DSI Ventures, Inc., http://dsiventures.com/wp-content/uploads/2013/02/PDS-Opticool-Mil.pdf.
ECHA European Chemicals Agency, Distillates (Petroleum), Hydrotreated Heavy Paraffinic, May 23, 2023, ECHA European Chemicals Agency.
Engineered Fluids, LLC, ElectroCool® Dielectric Coolants, Heat Transfer Fluids for Use in Electrical Applications, Data Sheet, Dec. 1, 2017, Engineered Fluids, LLC.
Engineered Fluids, LLC, MilSpec Fluid: EF-87252D Dielectric Coolant for Aircraft Avionic Systems and Electronics, Nov. 1, 2017, Engineered Fluids, LLC.
Cargill, FR3™ Envirotemp™ Natural Ester Fluid, 2014, Cargill.
Visser, Robert George, et al., Estimation of Reproducibility and Measurement Uncertainty of a Viscosity Test Method from Proficiency Test Data, Journal for Quality, Comparability and Reliability in Chemical Measurement, Feb. 24, 2015, vol. 20, No. 2, Springer-Verlag Berlin Heidelberg, The Netherlands.
Eurofins, BfB Oil Research, Physico Chemical Analysis, Analytic Report, Lab No. 2306214034, Jun. 21, 2023.
Eurofins, BfB Oil Research, Physico Chemical Analysis, Analytic Report, Lab No. 2306214035, Jun. 21, 2023.
Exxonmobil, Synesstic(TM) Alkylated Naphthalenes, Product Data Sheet, Jul. 2003.
Fuchs Europe Schmierstoffe GMBH, Die Welt der Schmierstoffe, 7_Industrieole, Renolin Therm, Sep. 2010, p. 576.
Prucnal, David, Doing More with Less: Cooling Computers with Immersion Pays Off, Analyst Report, 2013, pp. 1-10, republication by Green Revolution Cooling.
International Electrotechnical Commission, International Standard, Fluids for Electrotechnical Applications, IEC 60296, 2012, pp. 7-21, Edition 4.0.
INEOS Oligomers, Material Safety Data Sheet, Durasyn 162 Polyalphaolefins, Nov. 10, 2008, pp. 1-8.
INEOS Oligomers, Durasyn 162 Polyalphaolefin, Technical Data Sheet.
INEOS Oligomers, Durasyn 164 Polyalphaolefin, Technical Data Sheet.
INEOS Oligomers, Durasyn Polyalphaolefin Specification Ranges.
INEOS Oligomers, Durasyn Low Viscosity Polyalphaolefin Typical Properties, Apr. 2018.
Jin, L.W., et al., Ultra-Thin Minichannel LCP for EV Battery Thermal Management, Applied Energy 113, pp. 1786-1794, 2014, Elsevier.
Kobayashi, Manabu, et al., ,Viscosity Properties and Molecular Structure of Lube Base Oil Prepared from Fischer-Tropsch Waxes, Journal of the Japan Petroleum Institute, Mar. 29, 2005, pp. 365-372, vol. 48, No. 6.
MatWeb, ChevronTexaco ParaMount 1001 Paraffinic Process Oil, Material Property Data.
M&I Materials, Midel 7131 Synthetic Ester Transformer Fluid Fire Safe and Biodegradable, Product Data Sheet, 2017.
M&I Materials, MIDEL 7131, Safety Data Sheet, Apr. 2018, pp. 1-5.
M&I Materials, MIDEL Selection Guide, 2019, pp. 1-4,.

US Department of Defense, Military Specification Coolant Fluid, Hydrolytically Stable, Dielectric, MIL-C-87252A, Mar. 2, 1992.
ExxonMobil, Mobil SHC 600 Reihe, Performance Profil, 2016.
Muhamad, N.A., et al., Electrical and Chemical Properties of New Insulating Oil for Transformer Using Pure Coconut Oil, Journal of Advanced Research in Materials Science, 2016, pp. 1-9, vol. 25, No. 1.
Nadkarni, R.A. Kishore, Guide to ASTM Test Methods for the Analysis of Petroleum Products and Lubricants, ASTM Manual 44, 2000, pp. 1-389, West Conshohocken, PA.
Nadkarni, R.A. Kishore, Guide to ASTM Test Methods for Analysis of Petroleum Products and Lubricants, ASTM Manual Services, No. mnl44-2nd, 2007, ASTM International, West Conshohocken, PA.
Insulating Oils Handbook, pp. 14, 40, and 78, International Electrical Testing Association, 2009.
NiMAC UK, Calculate Viscosity at Given Temperature, nimacltd.co.uk/viscosity-calculators/calculate-the-viscosity-at-a-given-temperature-when-the-viscosity-is-known-at-two-temperatures.
Nyco, Synthetic Ester as Dielectric Fluids Ecological and High Performing Solutions—Nycodiel, National Conference on Environmental Friendly Insulating Liquids presentation, Nov. 2013, New Delhi, India.
Pambudi, Nugroho Agung, et al., Preliminary Experimental of GPU Immersion-Cooling, E3S Web of Conferences 93, 03003, 2019, EDP Sciences, https://www.e3s-conferences.org/articles/e3sconf/abs/2019/19/e3sconf_cgeee2018_03003/e3sconf_cgeee2018_03003.html.
PARATHERM, a Division of The Lubrizol Corporation, PARATHERM LR Safety Data Sheet, Apr. 18, 2016.
PARATHERM Corporation, PARATHERM LR Temperature Calculation Chart, 2011.
PARATHERM Corporation, PARATHERM-NF Heat Transfer Fluid Engineering Bulletin, NF 613, 2013.
PARATHERM Corporation, PARATHERM-LR Heat Transfer Fluid, Engineering Bulletin, LR 417, 2017.
Phillips 66, Transformer Oil Data Sheet, Jul. 12, 2016.
Carey, A.A., et al., Dielectric Constant and Oil Analysis, Practicing Oil Analysis Magazine, Sep. 2001, Noria Media, Tulsa, OK.
Pubchem, Diisooctyl Adipate, Flash Point, CID66932.
Anderol Inc., Royco 602 Coolant for Aircraft Avionics Systems, Product Data Sheet, Feb. 25, 2002, R602, East Hanover, NJ.
Shell, Shell GTL Fuel & Shell GTL Fuel Marine, Product Information, Feb. 2015, Version 2.0.
Shell, Shell XHVI-4 Material Safety Data Sheet, Jul. 12, 2011, Version 1.1.
Sigma-Aldrich, Diethylene Glycol Dibutyl Ether Safety Data Sheet, Jul. 6, 2022, Product No. 205621, Version 6.5.
Simons, Robert E., Direct Liquid Immersion Cooling for High Power Density Microelectronics, https://www.electronics-cooling.com/1996/05/direct-liquid-immersion-cooling-for-high-power-density-microelectronics/, printed Dec. 28, 2023, Electronic-Cooling.com digital publication.
Solvay, Galden HT PFPE Heat Transfer Fluids, Technical Data Sheet, 2014.
Solvay, Galden HT200, Technical Data Sheet, Apr. 2005.
Speight, James G., Handbook of Petroleum Product Analysis, pp. 260-261, 2002, John Wiley & Sons, Inc., Hoboken, NJ.
Stepan Company, Neobee M-20 Product Bulletin, Mar. 2010, Northfield, IL.
Ayel, Jean, Lubrifiants—Constitution, Mecanique Frottement, usure et lubrification, Jul. 10, 1997, Techniques de L'ingenieur, Saint-Denis Cedex, France.
Total Special Fluids, Isane, Isoparaffin Products, Product Brochure, Oct. 2010, Paris La Defense, France.
Totalenergies, Rapport D'Analyse, TotalEnergies, La Defense, France.
Endo, Toshio, et al., TSUBAME_KFC: A Modern Liquid Submersion Cooling Prototype Towards Exascale Becoming the Greenest Supercomputer in the World, Tokyo Institute for Technology, Japan.
Gastinger, Christian, Dielektrische Vergleichsmessungen an Reprasentativen OI-Board Anordningen, Jun. 2011, Graz University of Technology, Graz, Osterreich, Austria.

(56) References Cited

OTHER PUBLICATIONS

Sunpower, Convection Cooling, Jul. 1, 2014, www.Sunpower-uk.com, https://web.archive.org/web/20161214004001/http://www.sunpower-uk.com/glossary/what-is-convection-cooling/, accessed Dec. 21, 2023.
Pancho507, Immersion Cooling, Jan. 7, 2020. Wikipedia, Retrieved from https://en.wikipedia.org/w/index.php?title+immersion_cooling&oldid=934570582.
Rolfbrink, Immersion Cooling, May 7, 2019, Wikipedia, retrieved from https://en.wikipedia.org/w/index.php?title=immersion_cooling&oldid=895920191.
Flamingsilmaril, Viscosity, May 24, 2019, Wikipedia, https://en.wikipedia.org/w/index.php?title=viscosity&oldid=898586427, accessed on Dec. 21, 2023.
Acota, Immersion Cooling for Electric Vehicle Batteries in 3M Novec Engineered Fluid, Mar. 6, 2018, YouTube.
Denton, Tom, Electric and Hybrid Vehicles, Institute of the Motor Industry, pp. 68-70, Routledge, England, 2016.
Bruen, Thomas, Analysis of a Battery Management System (BMS) Control Strategy for Vibration Aged Nickel Manganese Cobalt Oxide (NMC) Lithium-Ion 18650 Battery Cells, MDPI Journal Energies, Apr. 1, 2016, pp. 1-20, vol. 9(4), Switzerland.
Rudnick, Leslie R., editor, Lubricant Additives Chemistry and Applications, Second Edition, 2009, pp. 13-15, 21, 39-41, CRC Press, Boca Raton, FL.
Mang, Theo, et al., editors, Lubricants and Lubrication, 2007, pp. 59-60 & 355, Wiley-VCH, Germany.
Soltex, Inc., OptiCool-87252 Fluid, Safety Data Sheet, Oct. 10, 2023, The Woodlands, TX.
Decagon Devices, KD2 Pro Thermal Properties Analyzer Operator Manual, Version 10, 2008-2011, Pullman, WA.
TotalEnergies "Analysis Report," filed in Opposition to EP3984092B1 on Dec. 27, 2003 (with pp. 1-6 of TotalEnergies OneTech Opposition and Consolidated List of Documents).†
Repsol Brochure for "Dielectric Oils", Feb. 2019.†
Cannon Flash Point Reference Materials, accessed on Jun. 25, 2023.†
Durasyn Polyalphaolefins Product Information Sheet, p. 1, Apr. 2018, INEOS Oligomers, retrieved from https://www.ineos.com/businesses/ineos-oligomers/products/durasyn-polyalphaolefin-pao/ submitted.†
Standard Test Method for Flash Point by Tag Closed Cup Tester, pp. 1-12, May 2005, ASTM International.†

\* cited by examiner
† cited by third party

ORGANIC HEAT TRANSFER SYSTEM, METHOD AND FLUID

BACKGROUND OF THE INVENTION

The disclosed technology relates to a heat transfer system and heat transfer method employing a dielectric oleaginous heat transfer fluid. In particular, the technology relates to a dielectric oleaginous heat transfer fluid with low electrical conductivity, low flammability, and low freeze point that provides excellent peak temperature reduction in a heat transfer system, such as that for cooling a power system of an electric vehicle.

The operation of a power source generates heat. A heat transfer system, in communication with the power source, regulates the generated heat, and ensures that the power source operates at an optimum temperature. The heat transfer system generally comprises a heat transfer fluid that facilitates absorbing and dissipating the heat from the power source. Heat transfer fluids, which generally consist of water and a glycol, can be expensive and are prone to freezing. Traditional heat transfer fluids can also exhibit extremely high conductivities, often in the range of 3000 microsiemens per centimeter ($\mu$S/cm) or more. This high conductivity produces adverse effects on the heat transfer system by promoting corrosion of metal parts, and also in the case of power sources where the heat transfer system is exposed to an electrical current, such as in fuels cells or the like, the high conductivity can lead to short circuiting of the electrical current and to electrical shock.

Although battery packs are designed to provide high levels of safety and stability, situations can arise where a portion of a battery pack experiences a local thermal condition which generates significant heat. When the temperature is great enough and sustained, the local thermal condition can transform into a runaway thermal condition affecting wide areas of the battery pack, and sometimes the entire battery pack under certain circumstances.

Current battery pack designs include an integrated and isolated cooling system that routes coolant throughout the enclosure. When in good working order, the coolant from the cooling system does not come into contact with the electric potentials protected within. It does happen that sometimes a leak occurs and coolant enters into unintended parts of the enclosure. If the coolant is electrically conductive, it can bridge terminals having relatively large potential differences. That bridging may start an electrolysis process in which the coolant is electrolyzed and the coolant will begin to boil when enough energy is conducted into the electrolysis. This boiling can create the local thermal condition that can lead to the runaway thermal condition described above.

A need exists for a heat transfer system and method employing an inexpensive heat transfer fluid with a low electrical conductivity and freeze point.

SUMMARY OF THE INVENTION

The disclosed technology, therefore, solves the problem of safety concerns in the cooling of electrical componentry by operating the electrical componentry while immersed in a dielectric oleaginous heat transfer fluid.

The method and/or system will be particularly useful in the transfer of heat from battery systems, such as those in an electric vehicle.

However, the method and/or system will also find use for other electrical componentry, such as, for example, in aircraft electronics, computer electronics, invertors, DC to DC convertors, chargers, phase change invertors, electric motors, electric motor controllers, and DC to AC invertors.

While many dielectric oleaginous heat transfer fluids may work in the method and/or system, it has been found that certain isoparaffins provide particularly improved heat transfer.

Isoparaffins (or isoparaffinic oils) suitable for use as immersion coolants include saturated branched hydrocarbon compounds containing 8 carbon atoms up to a maximum of 50 carbon atoms. The hydrocarbon compound can be further characterized as containing at least one branch and having a single continuous carbon chain of no more than 24 carbon atoms in length.

Cyclic structures (both saturated and unsaturated) are common in hydrocarbon fluids; the isoparaffin of the invention is free of or substantially free of cyclic structures.

It has also been found that certain ester, ethers, alkylated aromatic oils provide particularly improved heat transfer when used as the dielectric oleaginous heat transfer fluids in the disclosed method.

The heat transfer fluid will have a dielectric constant of no more than 5.0 (as measured by ASTM D924).

Also provided herein is an immersion coolant system for an electric vehicle. The system includes a battery pack situated in a bath, which bath is in fluid communication with a heat transfer fluid reservoir containing the dielectric oleaginous heat transfer fluid having. Here again, the dielectric oleaginous heat transfer fluid may be an isoparaffin, an ester, an ether, or an alkylated aromatic oil as described.

DETAILED DESCRIPTION OF THE INVENTION

Various preferred features and embodiments will be described below by way of non-limiting illustration.

The disclosed technology provides a method of cooling electrical componentry by immersing the electrical componentry in a bath comprising a dielectric oleaginous heat transfer fluid, and operating the electrical componentry.

Electrical componentry includes any electronics that utilize power and generate thermal energy that must be dissipated to prevent the electronics from overheating. Examples include aircraft electronics, computer electronics such as microprocessors, uninterruptable power supplies (UPSs), power electronics (such as IGBTs, SCRs, thyristers, capacitors, diodes, transistors, rectifiers and the like), and the like. Further examples include invertors, DC to DC convertors, chargers, phase change invertors, electric motors, electric motor controllers, and DC to AC invertors.

While several examples of electrical componentry have been provided, the heat transfer fluid may be employed in any assembly or for any electrical componentry to provide an improved heat transfer fluid with cold temperature performance without significantly increasing the electrical conductivity and potential flammability of the mixture.

The method and/or system will be particularly useful in the transfer of heat from battery systems, such as those in an electric vehicle such as an electric car, truck or even electrified mass transit vehicle, like a train or tram. The main piece of electrical componentry in electrified transportation is often battery modules, which may encompass one or more battery cell stacked relative to one another to construct the battery module. Heat may be generated by each battery cell during charging and discharging operations, or transferred into the battery cells during key-off conditions of the electrified vehicle as a result of relatively extreme (i.e., hot)

ambient conditions. The battery module will therefore include a heat transfer system for thermally managing the battery modules over a full range of ambient and/or operating conditions. In fact, operation of battery modules can occur during the use and draining of the power therefrom, such as in the operation of the battery module, or during the charging of the battery module. With regard to charging, the use of the heat transfer fluid can allow the charging of the battery module to at least 75% of the total battery capacity restored in a time period of less than 15 minutes.

Similarly, electrical componentry in electrified transportation can include fuel cells, solar cells, solar panels, photovoltaic cells and the like that require cooling by the heat transfer fluid. Such electrified transportation may also include traditional internal combustion engines as, for example, in a hybrid vehicle.

Electrified transportation may also include electric motors as the electrical componentry. Electric motors may be employed anywhere along the driveline of a vehicle to operate, for example, transmissions, axles and differentials. Such electric motors can be cooled by a heat transfer system employing the heat transfer fluid.

The method and/or system can include providing a heat transfer system containing electrical componentry requiring cooling. The heat transfer system will include, among other things, a bath in which the electrical componentry may be situated a manner that allows the electrical componentry to be in direct fluid communication with the heat transfer fluid. The bath will be in fluid communication with a heat transfer fluid reservoir and a heat exchanger.

The electrical componentry may be operated along with operating the heat transfer system. The heat transfer system may be operated, for example, by circulating the heat transfer fluid through the heat transfer system.

For example, the heat transfer system may include means to pump cooled heat transfer fluid from the heat transfer fluid reservoir into the bath, and to pump heated heat transfer fluid out of the bath through the heat exchanger and back into the heat transfer fluid reservoir. In this manner, while the electrically componentry are operated, the heat transfer system may also be operated to provide cooled heat transfer fluid to the electrical componentry to absorb heat generated by the electrical componentry, and to remove heat transfer fluid that has been heated by the electrical componentry to be sent to the heat exchanger for cooling and recirculation back into the heat transfer fluid reservoir.

Dielectric constant (also called relative permittivity) is an important feature of a heat transfer fluid for an immersion cooling system. To avoid issues with electrical current leakage, the heat transfer fluid into which the electrical componentry is immersed may have a dielectric constant of 5.0 or lower as measured according to ASTM D924. The dielectric constant of the heat transfer fluid can also be less than 4.5, 4.0, 3.0, 2.5, or less than 2.3 or less than 1.9.

The dielectric oleaginous heat transfer fluid can also have a kinematic viscosity measured at 100° C. of at least 0.7 cSt, or at least 0.9 cSt, or at least 1.1 cSt, or from 0.7 to 7.0 cSt, or from 0.9 to 6.5 cSt, or even from 1.1 to 6.0 cSt as measured according to ASTM D445_100. For a given chemical family and pump power, higher viscosity fluids are less effective at removing heat, given higher resistance to flow.

Immersion heat transfer fluids need to flow freely at very low temperatures. In one embodiment the dielectric oleaginous heat transfer fluid has a pour point of at least −50° C., or at least −40° C., or at least −30° C. as measured according to ASTM D5985. In one embodiment, the heat transfer fluid has an absolute viscosity of no more than 900 cP at −30° C., or no more than 500 cP at −30° C., or no more than 100 cP at −30° C. as measured according to ASTM D2983.

The dielectric oleaginous heat transfer fluid has a flash point of at least 50° C. as measured according to ASTM D56, or at least 60° C., or at least 75° C., or at least 100° C.

While many dielectric oleaginous heat transfer fluids may work in the method and/or system, it has been found that certain isoparaffins provide particularly improved heat transfer.

Isoparaffins (or isoparaffinic oils) are saturated hydrocarbon compounds containing at least one hydrocarbyl branch, sufficient to provide fluidity to both very low and high temperatures. Isoparaffins of the invention may include natural and synthetic oils, oil derived from hydrocracking, hydrogenation, and hydrofinishing of refined oils, re-refined oils or mixtures thereof.

Synthetic isoparaffin oils may be produced by isomerization of predominantly linear hydrocarbons to produce branched hydrocarbons. Linear hydrocarbons may be naturally sourced, synthetically prepared, or derived from Fischer-Tropsch reactions or similar processes. Isoparaffins may be derived from hydro-isomerized wax and typically may be hydro-isomerised Fischer-Tropsch hydrocarbons or waxes. In one embodiment oils may be prepared by a Fischer-Tropsch gas-to-liquid synthetic procedure as well as other gas-to-liquid oils.

Suitable isoparaffins may also be obtained from natural, renewable, sources. Natural (or bio-derived) oils refer to materials derived from a renewable biological resource, organism, or entity, distinct from materials derived from petroleum or equivalent raw materials. Natural sources of hydrocarbon oil include fatty acid triglycerides, hydrolyzed or partially hydrolyzed triglycerides, or transesterified triglyceride esters, such as fatty acid methyl ester (or FAME). Suitable triglycerides include, but are not limited to, palm oil, soybean oil, sunflower oil, rapeseed oil, olive oil, linseed oil, and related materials. Other sources of triglycerides include, but are not limited to algae, animal tallow, and zooplankton. Linear and branched hydrocarbons may be rendered or extracted from vegetable oils and hydro-refined and/or hydro-isomerized in a manner similar to synthetic oils to produce isoparaffins.

Another class of isoparaffinic oils includes polyalphaolefins (PAO). Polyolefins are well known in the art. In one embodiment, the polyolefin may be derivable (or derived) from olefins with 2 to 24 carbon atoms. By derivable or derived it is meant the polyolefin is polymerized from the starting polymerizable olefin monomers having the noted number of carbon atoms or mixtures thereof. In embodiments, the polyolefin may be derivable (or derived) from olefins with 3 to 24 carbon atoms. In some embodiments, the polyolefin may be derivable (or derived) from olefins with 4 to 24 carbon atoms. In further embodiments, the polyolefin may be derivable (or derived) from olefins with 5 to 20 carbon atoms. In still further embodiments, the polyolefin may be derivable (or derived) from olefins with 6 to 18 carbon atoms. In still further embodiments, the polyolefin may be derivable (or derived) from olefins with 8 to 14 carbon atoms. In alternate embodiments, the polyolefin may be derivable (or derived) from olefins with 8 to 12 carbon atoms.

Often the polymerizable olefin monomers comprise one or more of propylene, isobutene, 1-butene, isoprene, 1,3-butadiene, or mixtures thereof. An example of a useful polyolefin is polyisobutylene.

Polyolefins also include poly-α-olefins derivable (or derived) from α-olefins. The α-olefins may be linear or branched or mixtures thereof. Examples include monoolefins such as propylene, 1-butene, isobutene, 1-pentene, 1-hexene, 1-heptene, 1-octene, 1-nonene, 1-decene, etc. Other examples of α-olefins include 1-decene, 1-undecene, 1-dodecene, 1-tridecene, 1-tetradecene, 1-pentadecene, 1-hexadecene, 1-heptadecene 1-octadecene, and mixtures thereof. An example of a useful α-olefin is 1-dodecene. An example of a useful poly-α-olefin is poly-decene.

The polyolefin may also be a copolymer of at least two different olefins, also known as an olefin copolymer (OCP). These copolymers are preferably copolymers of a-olefins having from 2 to about 28 carbon atoms, preferably copolymers of ethylene and at least one α-olefin having from 3 to about 28 carbon atoms, typically of the formula $CH_2=CHR_1$ wherein $R_1$ is a straight chain or branched chain alkyl radical comprising 1 to 26 carbon atoms. Preferably $R_1$ in the above formula can be an alkyl of from 1 to 8 carbon atoms, and more preferably can be an alkyl of from 1 to 2 carbon atoms. Preferably, the polymer of olefins is an ethylene-propylene copolymer.

Where the olefin copolymer includes ethylene, the ethylene content is preferably in the range of 20 to 80 percent by weight, and more preferably 30 to 70 percent by weight. When propylene and/or 1-butene are employed as comonomer(s) with ethylene, the ethylene content of such copolymers is most preferably 45 to 65 percent, although higher or lower ethylene contents may be present.

The isoparaffinic oils may be substantially free of ethylene and polymers thereof. The composition may be completely free of ethylene and polymers thereof. By substantially free, it is meant that the composition contains less than 50 ppm, or less than 30 ppm, or even less than 10 ppm or 5 ppm, or even less than 1 ppm of the given material.

The isoparaffinic oils may be substantially free of propylene and polymers thereof. The isoparaffinic oils may be completely free of propylene and polymers thereof. The polyolefin polymers prepared from the aforementioned olefin monomers can have a number average molecular weight of from 140 to 5000. The polyolefin polymers prepared from the aforementioned olefin monomers can also have a number average molecular weight of from 200 to 4750. The polyolefin polymers prepared from the aforementioned olefin monomers can also have a number average molecular weight of from 250 to 4500. The polyolefin polymers prepared from the aforementioned olefin monomers can also have a number average molecular weight of from 500 to 4500. The polyolefin polymers prepared from the aforementioned olefin monomers can also have a number average molecular weight of from 750 to 4000. as measured by gel permeation chromatography with polystyrene standard.

Mixtures of mineral oil and synthetic oils, e.g., polyalphaolefin oils and/or polyester oils, may be used.

The isoparaffin oil can be a saturated hydrocarbon compound containing 8 carbon atoms up to a maximum of 50 carbon atoms and having at least one hydrocarbyl branch containing at least one carbon atom. In one embodiment, the saturated hydrocarbon compound can have at least 10 or at least 12 carbon atoms. In one embodiment, the saturated hydrocarbon compound can contain 14 to 34 carbon atoms with the proviso that the longest continuous chain of carbon atoms is no more than 24 carbons in length.

In embodiments, the isoparaffin oil will have a longest continuous chain of carbon atoms of no more than 24 carbons in length.

In embodiments, the saturated hydrocarbon compound can be a branched acyclic compound with a molecular weight of 140 g/mol to 550 g/mol as measured by size exclusion chromatography (SEC also called gel permeation chromatography or GPC), liquid chromatography, gas chromatography, mass spectrometry, NMR, or combinations thereof, or from 160 g/mol to 480 g/mol.

Mineral oils often contain cyclic structures, i.e. aromatics or cycloparaffins also called naphthenes. In one embodiment, the isoparaffin comprises a saturated hydrocarbon compound free of or substantially free of cyclic structures. By substantially free, it is meant there is less than 1 mol % of cyclic structures in the mineral oil, or less than 0.75 mol %, or less than 0.5 mol %, or even less than 0.25 mol %. In some embodiments, the mineral oil is completely free of cyclic structures.

It has also been found that certain ester oils and ether oils as well provide particularly improved heat transfer when used as the dielectric oleaginous heat transfer fluids in the disclosed method.

Esters suitable for use as dielectric oleaginous heat transfer fluids include esters of monocarboxylic acids with monohydric alcohols; di-esters of diols with monocarboxylic acids and di-esters of dicarboxylic acids with monohydric alcohols; polyol esters of monocarboxylic acids and polyesters of monohydric alcohols with polycarboxylic acids; and mixtures thereof. Esters may be broadly grouped into two categories: synthetic and natural.

Synthetic esters suitable as the dielectric oleaginous heat transfer fluids may comprise esters of monocarboxylic acid (such as neopentanoic acid, 2-ethylhexanoic acid) and dicarboxylic acids (e.g., phthalic acid, succinic acid, alkyl succinic acids and alkenyl succinic acids, maleic acid, azelaic acid, suberic acid, sebacic acid, fumaric acid, adipic acid, linoleic acid dimer, malonic acid, alkyl malonic acids, and alkenyl malonic acids) with any of variety of monohydric alcohols (e.g., butyl alcohol, pentyl alcohol, neopentyl alcohol, hexyl alcohol, octyl alcohol, iso-octyl alcohol, nonyl alcohol, decyl alcohol, isodecyl alcohol, dodecyl alcohol, tetradecyl alcohol, hexadecyl alcohol, 2-ethylhexyl alcohol, ethylene glycol, diethylene glycol monoether, and propylene glycol). Specific examples of these esters include dibutyl adipate, di(2-ethylhexyl) sebacate, di-n-hexyl fumarate, dioctyl sebacate, diisooctyl azelate, diisodecyl azelate, dioctyl phthalate, didecyl phthalate, dieicosyl sebacate, the 2-ethylhexyl diester of linoleic acid dimer, and the complex ester formed by reacting one mole of sebacic acid with two moles of tetraethylene glycol and two moles of 2-ethylhexanoic acid. Other synthetic esters include those made from $C_5$ to $C_{12}$ monocarboxylic acids and polyols and polyol ethers such as neopentyl glycol, trimethylolpropane, pentaerythritol, dipentaerythritol, and tripentaerythritol. Esters can also be monoesters of mono-carboxylic acids and monohydric alcohols.

Natural (or bio-derived) esters refer to materials derived from a renewable biological resource, organism, or entity, distinct from materials derived from petroleum or equivalent raw materials. Natural esters suitable as the dielectric oleaginous heat transfer fluids include fatty acid triglycerides, hydrolyzed or partially hydrolyzed triglycerides, or transesterified triglyceride esters, such as fatty acid methyl ester (or FAME). Suitable triglycerides include, but are not limited to, palm oil, soybean oil, sunflower oil, rapeseed oil, olive oil, linseed oil, and related materials. Other sources of triglycerides include, but are not limited to, algae, animal tallow, and zooplankton.

Other suitable oleaginous fluids include alkylated aromatic oils (such as alkylated naphthalene), low viscosity naphthenic mineral oils, and (poly)ether oils. Alkylene oxide polymers and interpolymers and derivatives thereof, and those where terminal hydroxyl groups have been modified by, for example, esterification or etherification, constitute other classes of known synthetic lubricating oils that can be used. Examples of (poly)ether base oils include diethylene glycol dibutyl ether.

A thermal management system as disclosed herein may remove heat at a rate that allows for rapid charging of a battery. The target for high speed charging includes 120-600 kW. Given a 95% efficiency in the charge, the heat transfer fluid would need to remove up to 30 kW in a time of 10 to 60 minutes.

Various embodiments of the compositions disclosed herein may optionally comprise one or more additional performance additives. These additional performance additives may include one or more flame retardants, smoke suppressants, antioxidants, combustion suppressants, metal deactivators, flow additives, corrosion inhibitors, foam inhibitors, demulsifiers, pour point depressants, seal swelling agents, and any combination or mixture thereof. Typically, fully-formulated heat transfer fluids may contain one or more of these performance additives, and often a package of multiple performance additives. In one embodiment, one or more additional additives may be present at 0.01 weight percent up to 3 weight percent, or 0.05 weight percent up to 1.5 weight percent, or 0.1 weight percent up to 1.0 weight percent.

As used herein, the term "hydrocarbyl" is used in its ordinary sense, which is well-known to those skilled in the art. Specifically, it refers to a group having a carbon atom directly attached to the remainder of the molecule and having predominantly hydrocarbon character. Examples of hydrocarbyl groups include:

hydrocarbon substituents, that is, aliphatic (e.g., alkyl or alkenyl), alicyclic (e.g., cycloalkyl, cycloalkenyl) substituents, and aromatic-, aliphatic-, and alicyclic-substituted aromatic substituents, as well as cyclic substituents wherein the ring is completed through another portion of the molecule (e.g., two substituents together form a ring);

substituted hydrocarbon substituents, that is, substituents containing non-hydrocarbon groups which, in the context of this invention, do not alter the predominantly hydrocarbon nature of the substituent (e.g., halo (especially chloro and fluoro), hydroxy, alkoxy, mercapto, alkylmercapto, nitro, nitroso, and sulfoxy);

hetero substituents, that is, substituents which, while having a predominantly hydrocarbon character, in the context of this invention, contain other than carbon in a ring or chain otherwise composed of carbon atoms and encompass substituents as pyridyl, furyl, thienyl and imidazolyl. Heteroatoms include sulfur, oxygen, and nitrogen. In general, no more than two, or no more than one, non-hydrocarbon substituent will be present for every ten carbon atoms in the hydrocarbyl group; alternatively, there may be no non-hydrocarbon substituents in the hydrocarbyl group.

It is known that some of the materials described above may interact in the final formulation, so that the components of the final formulation may be different from those that are initially added. For instance, metal ions (of, e.g., a detergent) can migrate to other acidic or anionic sites of other molecules. The products formed thereby, including the products formed upon employing the composition of the present invention in its intended use, may not be susceptible of easy description. Nevertheless, all such modifications and reaction products are included within the scope of the present invention; the present invention encompasses the composition prepared by admixing the components described above.

The invention herein is useful for cooling electrical componentry during operation, which may be better understood with reference to the following examples.

EXAMPLES

A series of oil-miscible oleaginous fluids were evaluated for their ability to disperse and conduct thermal energy. The fluids range from simple isoparaffinic hydrocarbons (IH) to alkylated aromatic compounds and aliphatic esters and ethers. The oils are summarized below (Table 1).

TABLE 1

Oleaginous Test Fluids

| ID | Base Fluid Type | $KV25^2$ $(m^2/s)$ | $KV40^3$ $(m^2/s)$ | $SG25^4$ (g/ml) | Dielectric Constant |
|---|---|---|---|---|---|
| EX1 | Water:Ethylene glycol (50:50 w:w) | 3.7 | 1.7 | 1.08 | 63 |
| EX2 | C11-13[1] Isoparaffinic Hydrocarbon (IH) | 2.0 | 1.5 | 0.76 | 2.03 |
| EX3 | C13-14[1] IH | 3.6 | 2.7 | 0.78 | 2.02 |
| EX4 | Naphthenic Mineral oil | 5.0 | 3.5 | 0.87 | 2.3 |
| EX5 | Polyalphaolefin | 8.0 | 5.0 | 0.79 | 2.04 |
| EX6 | C13-16[1] IH | 6.1 | 4.1 | 0.79 | 2.0 |
| EX7 | Diisooctyl adipate Ester | 14 | 9.0 | 0.92 | 3.4 |
| EX8 | Alkylated naphthalene | 61 | 29 | 0.90 | 2.9 |
| EX9 | Neopentanoic acid isodecylester | 4.3 | 3.0 | 0.85 | 3.56 |
| EX10 | Diethylene glycol dibutylether | 2.1 | 1.6 | 0.87 | 4.26 |

[1]Predominant molecular distribution, may contain low levels outside of range
[2]Carried out according to ASTM D445_25
[3]Carried out according to ASTM D445_40
[4]Carried out according to ASTM D854

Testing

Fluids were tested for their ability to disperse heat in the Quenchalyzer test, according to ASTM D6200, with the following adjustments.

The test was modified to preheat the Inconel 600 test cylinder to 200° C. vs. the normal 800° C. The fluid was also preheated to 25° C. vs. the normal 40° C. Both of the modifications were designed to stay below the autoignition temperatures for the fluids studied which are typically in the 350 to 400° C. range. Quenchalyzer test provided for maximum cooling rate of the of the Inconel test cylinder. The cooling rate of the cylinder correlates directly with the fluid ability to absorb and remove heat from the test cylinder. Heat capacity of the test fluids was measured by ASTM E2716. Thermal conductivity of the test fluids was measured by ASTM D7896. Thermal testing is summarized in Table 2.

TABLE 2

Thermal Testing

| ID | Dielectric Const | Heat Capacity 25° C. (J/(g · ° C.) | Thermal Conductivity at 25° C. (W · m/° K) | Max Cooling Rate (° C./s) |
|---|---|---|---|---|
| EX1 | 63 | 3.66 | 0.35 | nd |
| EX2 | 2.03 | 2.02 | 0.15 | 13.6 |
| EX3 | 2.02 | 2.56 | 0.10 | 7.1 |

TABLE 2-continued

Thermal Testing

| ID | Dielectric Const | Heat Capacity 25° C. (J/(g · ° C.)) | Thermal Conductivity at 25° C. (W · m/° K) | Max Cooling Rate (° C./s) |
| --- | --- | --- | --- | --- |
| EX4 | 2.3 | 1.78 | nd | 4.8 |
| EX5 | 2.04 | 2.46 | 0.14 | 4.3 |
| EX6 | 2.0 | 2.03 | 0.11 | 5.6 |
| EX7 | 3.4 | 2.3 | 0.14 | 6.7 |
| EX8 | 2.9 | 1.81 | 0.19 | 4.4 |
| EX9 | 3.6 | 2.02 | 0.11 | nd |
| EX10 | 4.3 | nd | nd | nd |

The results show that the fluids of the invention provide acceptable removal of heat, at useful kinematic viscosities, while introducing insignificant conductivity compared, for example, to water.

Each of the documents referred to above is incorporated herein by reference, including any prior applications, whether or not specifically listed above, from which priority is claimed. The mention of any document is not an admission that such document qualifies as prior art or constitutes the general knowledge of the skilled person in any jurisdiction. Except in the Examples, or where otherwise explicitly indicated, all numerical quantities in this description specifying amounts of materials, reaction conditions, molecular weights, number of carbon atoms, and the like, are to be understood as modified by the word "about." It is to be understood that the upper and lower amount, range, and ratio limits set forth herein may be independently combined. Similarly, the ranges and amounts for each element of the invention can be used together with ranges or amounts for any of the other elements.

As used herein, the transitional term "comprising," which is synonymous with "including," "containing," or "characterized by," is inclusive or open-ended and does not exclude additional, un-recited elements or method steps. However, in each recitation of "comprising" herein, it is intended that the term also encompass, as alternative embodiments, the phrases "consisting essentially of" and "consisting of," where "consisting of" excludes any element or step not specified and "consisting essentially of" permits the inclusion of additional un-recited elements or steps that do not materially affect the essential or basic and novel characteristics of the composition or method under consideration.

While certain representative embodiments and details have been shown for the purpose of illustrating the subject invention, it will be apparent to those skilled in this art that various changes and modifications can be made therein without departing from the scope of the subject invention. In this regard, the scope of the invention is to be limited only by the following claims.

A method of cooling electrical componentry comprising, consisting essentially of, or consisting of immersing the electrical componentry in a bath comprising, consisting essentially of, or consisting of a dielectric oleaginous heat transfer fluid having a kinematic viscosity measured at 100° C. of 0.7 to 7.0 cSt as measured according to ASTM D445_100, and a flash point of at least 50° C. as measured according to ASTM D56, and removing heat from said electrical componentry. An immersion coolant system for an electric vehicle comprising a battery pack situated in a bath, wherein the bath is in fluid communication with a heat transfer fluid reservoir comprising a dielectric oleaginous heat transfer fluid having a kinematic viscosity measured at 100° C. of 0.7 to 7.0 cSt and a flash point of at least 50° C.

The method and/or system of the previous paragraph, wherein the electrical componentry comprises, consists essentially of, consists of a battery. The method and/or system of the previous sentence wherein the electrical componentry comprises multiple battery cells stacked relative to one another to construct a battery module. The method and/or system of the previous sentence, wherein the battery operates an electric vehicle. The method and/or system of the previous sentence, wherein the electric vehicle comprises, consists essentially of, consists of an electric car. The method and/or system of the previous sentence, wherein the electric vehicle comprises, consists essentially of, consists of a truck. The method and/or system of the previous sentence, wherein the electric vehicle comprises, consists essentially of, consists of an electrified mass transit vehicle. The method and/or system of the previous paragraph, wherein the electrical componentry comprises, consists essentially of, consists of aircraft electronics. The method and/or system of the previous paragraph, wherein the electrical componentry comprises, consists essentially of, consists of computer electronics. The method and/or system of the previous paragraph, wherein the electrical componentry comprises, consists essentially of, consists of invertors. The method and/or system of the previous paragraph, wherein the electrical componentry comprises, consists essentially of, consists of DC to DC convertors. The method and/or system of the previous paragraph, wherein the electrical componentry comprises, consists essentially of, consists of chargers. The method and/or system of the previous paragraph, wherein the electrical componentry comprises, consists essentially of, consists of electric motors. The method and/or system of the previous paragraph, wherein the electrical componentry comprises, consists essentially of, consists of electric motor controllers. The method and/or system of the previous paragraph, wherein the electrical componentry comprises, consists essentially of, consists of microprocessors. The method and/or system of the previous paragraph, wherein the electrical componentry comprises, consists essentially of, consists of uninterruptable power supplies (UPSs). The method and/or system of the previous paragraph, wherein the electrical componentry comprises, consists essentially of, consists of power electronics. The method and/or system of the previous paragraph, wherein the electrical componentry comprises, consists essentially of, consists of IGBTs. The method and/or system of the previous paragraph, wherein the electrical componentry comprises, consists essentially of, consists of SCRs. The method and/or system of the previous paragraph, wherein the electrical componentry comprises, consists essentially of, consists of thyristers. The method and/or system of the previous paragraph, wherein the electrical componentry comprises, consists essentially of, consists of capacitors. The method and/or system of the previous paragraph, wherein the electrical componentry comprises, consists essentially of, consists of diodes. The method and/or system of the previous paragraph, wherein the electrical componentry comprises, consists essentially of, consists of transistors. The method and/or system of the previous paragraph, wherein the electrical componentry comprises, consists essentially of, consists of rectifiers. The method and/or system of the previous paragraph, wherein the electrical componentry comprises, consists essentially of, consists of DC to AC invertors. The method and/or system of any previous sentence wherein the method and/or system further comprises operating the electrical componentry in charging operations. The method and/or system of any previous sentence wherein the method and/or system further comprises operating the electrical componentry in discharging operations. The method and/or system of any previous sentence wherein the step of removing heat comprises removing heat transferred into the electrical componentry as a result of extreme ambient conditions. The method and/or system of any previous sentence wherein the heat transfer fluid enables the charging of the battery module to at least 75% of the total battery capacity restored in a time period of less than 15 minutes. The method and/or system of the previous paragraph, wherein the electrical componentry comprises, consists essentially of, consists of fuel cells. The method and/or system of the previous paragraph, wherein the electrical componentry comprises, consists essentially of, consists of solar cells. The method and/or system of the previous paragraph, wherein the electrical componentry comprises, consists essentially of, consists of solar panels. The method and/or system of the previous paragraph, wherein the electrical componentry comprises, consists essentially of, consists of photovoltaic cells. The method and/or system of the previous paragraph, wherein the electrical vehicle further comprises, consists essentially of, consists of an internal combustion engine. The method and/or system of any previous sentence wherein removing heat from said electrical componentry comprises, consists essentially of, or consists of situating the electrical componentry in a bath to be in direct fluid communication with the heat transfer fluid and circulating the heat transfer fluid through a heat transfer system. The method and/or system of any previous sentence, wherein the bath of the heat transfer system is in fluid communication with a heat transfer fluid reservoir and a heat exchanger.

The method and/or system of any sentence of any previous paragraph, wherein the dielectric oleaginous heat transfer fluid has a dielectric constant of 5.0 or lower as measured according to ASTM D924. The method and/or system of any sentence of any previous paragraph, wherein the dielectric oleaginous heat transfer fluid has a dielectric constant of 4.5 or lower as measured according to ASTM D924. The method and/or system of any sentence of any previous paragraph, wherein the dielectric oleaginous heat transfer fluid has a dielectric constant of 4.0 or lower as measured according to ASTM D924. The method and/or system of any sentence of any previous paragraph, wherein the dielectric oleaginous heat transfer fluid has a dielectric constant of 3.0 or lower as measured according to ASTM D924. The method and/or system of any sentence of any previous paragraph, wherein the dielectric oleaginous heat transfer fluid has a dielectric constant of 2.5 or lower as measured according to ASTM D924. The method and/or system of any sentence of any previous paragraph, wherein the dielectric oleaginous heat transfer fluid has a dielectric constant of 2.3 or lower as measured according to ASTM D924. The method and/or system of any sentence of any previous paragraph, wherein the dielectric oleaginous heat transfer fluid has a dielectric constant of 1.9 or lower as measured according to ASTM D924.

The method and/or system of any sentence of any previous paragraph wherein the oleaginous heat transfer fluid has a flash point of at least at least 75° C. The method and/or system of any sentence of any previous paragraph wherein the oleaginous heat transfer fluid has a flash point of at least at least 60° C. The method and/or system of any sentence of any previous paragraph wherein the oleaginous heat transfer fluid has a flash point of at least at least 50° C.

The method and/or system of any sentence of any previous paragraph, wherein the oleaginous heat transfer fluid has a pour point of at least −30° C. as measured according to ASTM D5985. The method and/or system of any sentence of any previous paragraph, wherein the oleaginous heat transfer fluid has a pour point of at least −40° C. as measured according to ASTM D5985. The method and/or system of any sentence of any previous paragraph, wherein the oleaginous heat transfer fluid has a pour point of at least −50° C. as measured according to ASTM D5985.

The method and/or system of any sentence of any previous paragraph, wherein the oleaginous heat transfer fluid has an absolute viscosity of no more than 900 cP at −30° C. as measured according to ASTM D2983 at −30° C. The method and/or system of any sentence of any previous paragraph, wherein the oleaginous heat transfer fluid has an absolute viscosity of no more than 500 cP at −30° C. as measured according to ASTM D2983 at −30° C. The method and/or system of any sentence of any previous paragraph, wherein the oleaginous heat transfer fluid has an absolute viscosity of no more than 100 cP at −30° C. as measured according to ASTM D2983 at −30° C.

The method and/or system of any sentence of any previous paragraph, wherein the oleaginous heat transfer fluid comprises, consists essentially of, consists of, a natural isoparaffin. The method and/or system of any sentence of any previous paragraph, wherein the oleaginous heat transfer fluid comprises, consists essentially of, consists of, a synthetic isoparaffin. The method and/or system of any sentence of any previous paragraph, wherein the oleaginous heat transfer fluid comprises, consists essentially of, consists of, an isoparaffin derived from petroleum or equivalent raw materials. The method and/or system of any sentence of any previous paragraph, wherein the oleaginous heat transfer fluid comprises, consists essentially of, consists of, an isoparaffin derived from natural sources. The method and/or system of any sentence of any previous paragraph, wherein the oleaginous heat transfer fluid comprises, consists essentially of, consists of, an isoparaffin derived from triglycerides. The method and/or system of any sentence of any previous paragraph, wherein the oleaginous heat transfer fluid comprises, consists essentially of, consists of, a polyalphaolefin. The method and/or system of any sentence of any previous paragraph, wherein the oleaginous heat transfer fluid comprises, consists essentially of, consists of, a polyalphaolefin of number average molecular weight of from 140 to 5000 as measured by gel permeation chromatography with polystyrene standard. The method and/or system of any sentence of any previous paragraph, wherein the oleaginous heat transfer fluid comprises, consists essentially of, consists of, a polyalphaolefin of number average molecular weight of from 200 to 4750 as measured by gel permeation chromatography with polystyrene standard. The method and/or system of any sentence of any previous paragraph, wherein the oleaginous heat transfer fluid comprises, consists essentially of, consists of, a polyalphaolefin of number average molecular weight of from 250 to 4500 as measured by gel permeation chromatography with polystyrene standard. The method and/or system of any sentence of any previous paragraph, wherein the oleaginous heat transfer fluid comprises, consists essentially of, consists of, a polyalphaolefin of number average molecular weight of from 500 to 4500 as measured by gel permeation chromatography with polystyrene standard. The method and/or system of any sentence of any previous paragraph, wherein the oleaginous heat transfer fluid comprises, consists essentially of, consists of, a polyalphaolefin of number average molecular weight of from 750 to 4000 as measured by gel permeation chromatography with polystyrene standard. The method and/or system of any sentence of any previous paragraph, wherein the oleaginous heat transfer fluid comprises, consists essentially of, consists of, a polyalphaolefin polymerized from a C2-C24 olefin or mixture thereof. The method and/or system of any sentence of any previous paragraph, wherein the oleaginous heat transfer fluid comprises, consists essentially of, consists of, a polyalphaolefin polymerized from a C3-C24 olefin or mixture thereof. The method and/or system of any sentence of any previous paragraph, wherein the oleaginous heat transfer fluid comprises, consists essentially of, consists of, a polyalphaolefin polymerized from a C4-C24 olefin or mixture thereof. The method and/or system of any sentence of any previous paragraph, wherein the oleaginous heat transfer fluid comprises, consists essentially of, consists of, a polyalphaolefin polymerized from a C5-C20 olefin or mixture thereof. The method and/or system of any sentence of any previous paragraph, wherein the oleaginous heat transfer fluid comprises, consists essentially of, consists of, a polyalphaolefin polymerized from a C6-C18 olefin or mixture thereof. The method and/or system of any sentence of any previous paragraph, wherein the oleaginous heat transfer fluid comprises, consists essentially of, consists of, a polyalphaolefin polymerized from a C8-C14 olefin or mixture thereof. The method and/or system of any sentence of any previous paragraph, wherein the oleaginous heat transfer fluid comprises, consists essentially of, consists of, a polyalphaolefin polymerized from a C8-C12 olefin or mixture thereof. The method and/or system of any sentence of any previous paragraph, wherein the oleaginous heat transfer fluid comprises, consists essentially of, consists of a propylene polymer. The method and/or system of any sentence of any previous paragraph, wherein the oleaginous heat transfer fluid comprises, consists essentially of, consists of an isobutene polymer. The method and/or system of any sentence of any previous paragraph, wherein the oleaginous heat transfer fluid comprises, consists essentially of, consists of a 1-butene polymer. The method and/or system of any sentence of any previous paragraph, wherein the oleaginous heat transfer fluid comprises, consists essentially of, consists of an isoprene polymer. The method and/or system of any sentence of any previous paragraph, wherein the oleaginous heat transfer fluid comprises, consists essentially of, consists of a 1,3-butadiene polymer. The method and/or system of any sentence of any previous paragraph, wherein the oleaginous heat transfer fluid comprises, consists essentially of, consists of a polyisobutylene polymer.

The method and/or system of any sentence of any previous paragraph, wherein the oleaginous heat transfer fluid comprises, consists essentially of, consists of a polyisobutylene polymer having a number average molecular weight from 140 to 5000. The method and/or system of any sentence of any previous paragraph, wherein the oleaginous heat transfer fluid comprises, consists essentially of, consists of a polyisobutylene polymer having a number average molecular weight of from 200 to 4500. The method and/or system of any sentence of any previous paragraph, wherein the oleaginous heat transfer fluid comprises, consists essentially of, consists of a polyisobutylene polymer having a number average molecular weight of from 250 to 4000. The method and/or system of any sentence of any previous paragraph, wherein the oleaginous heat transfer fluid comprises, consists essentially of, consists of a polyisobutylene polymer having a number average molecular weight of from 300 to 3500. The method and/or system of any sentence of any previous paragraph, wherein the oleaginous heat transfer fluid comprises, consists essentially of, consists of a polyisobutylene polymer having a number average molecular weight of from 350 to 3000. The method and/or system of any sentence of any previous paragraph, wherein the oleaginous heat transfer fluid comprises, consists essentially of, consists of a polyisobutylene polymer having a number average molecular weight of from 400 to 2500 as measured by gel permeation chromatography with a polystyrene standard The composition of any sentence of any previous paragraph, wherein the at least one branched polyolefin polymer is polymerized from C4-C24 α-olefin or mixture thereof. The composition of any sentence of any previous paragraph, wherein the at least one branched polyolefin polymer is polymerized from 1-pentene. The composition of any sentence of any previous paragraph, wherein the at least one branched polyolefin polymer is polymerized from 1-hexene. The composition of any sentence of any previous paragraph, wherein the at least one branched polyolefin polymer is polymerized from 1-heptene. The composition of any sentence of any previous paragraph, wherein the at least one branched polyolefin polymer is polymerized from 1-octene. The composition of any sentence of any previous paragraph, wherein the at least one branched polyolefin polymer is polymerized from 1-nonene. The composition of any sentence of any previous paragraph, wherein the at least one branched polyolefin polymer is polymerized from 1-decene. The composition of any sentence of any previous paragraph, wherein the at least one branched polyolefin polymer is polymerized from 1-decene. The composition of any sentence of any previous paragraph, wherein the at least one branched polyolefin polymer is polymerized from 1-undecene. The composition of any sentence of any previous paragraph, wherein the at least one branched polyolefin polymer is polymerized from 1-dodecene. The composition of any sentence of any previous paragraph, wherein the at least one branched polyolefin polymer is polymerized from 1-tridecene. The composition of any sentence of any previous paragraph, wherein the at least one branched polyolefin polymer is polymerized from 1-tetradecene. The composition of any sentence of any previous paragraph, wherein the at least one branched polyolefin polymer is polymerized from 1-pentadecene. The composition of any sentence of any previous paragraph, wherein the at least one branched polyolefin polymer is polymerized from 1-hexadecene. The composition of any sentence of any previous paragraph, wherein the at least one branched polyolefin polymer is polymerized from 1-heptadecene. The composition of any sentence of any previous paragraph, wherein the at least one branched polyolefin polymer is polymerized from 1-octadecene. The composition of any sentence of any previous paragraph, wherein the at least one branched polyolefin polymer is polymerized from 1-nonadecene. The composition of any sentence of any previous paragraph, wherein the at least one branched polyolefin polymer is polymerized from 1-eicosene. The composition of any sentence of any previous paragraph, wherein the at least one branched polyolefin polymer is polymerized from 1-heneicosene. The composition of any sentence of any previous paragraph, wherein the at least one branched polyolefin polymer is polymerized from 1-docosene. The composition of any sentence of any previous paragraph, wherein the at least one branched polyolefin polymer is polymerized from 1-tricosene. The composition of any sentence of any previous paragraph, wherein the at least one branched polyolefin polymer is polymerized from 1-tetracosene.

The method and/or system of any sentence of any previous paragraph, wherein the oleaginous heat transfer fluid comprises, consists essentially of, consists of a 1000 to 5000 Mn polydecene polymer as measured by gel permeation chromatography with a polystyrene standard. The method and/or system of any sentence of any previous paragraph, wherein the oleaginous heat transfer fluid comprises, consists essentially of, consists of a 1250 to 4750 Mn polydecene polymer as measured by gel permeation chromatography with a polystyrene standard. The method and/or system of any sentence of any previous paragraph, wherein the oleaginous heat transfer fluid comprises, consists essentially of, consists of a 1500 to 4500 Mn polydecene polymer as measured by gel permeation chromatography with a polystyrene standard. The method and/or system of any sentence of any previous paragraph, wherein the oleaginous heat transfer fluid comprises, consists essentially of, consists of a 2000 to 4250 Mn polydecene polymer as measured by gel permeation chromatography with a polystyrene standard. The method and/or system of any sentence of any previous paragraph, wherein the oleaginous heat transfer fluid comprises, consists essentially of, consists of a 2500 to 4000 Mn polydecene polymer as measured by gel permeation chromatography with a polystyrene standard.

The method and/or system of any sentence of any previous paragraph, wherein the oleaginous heat transfer fluid comprises, consists essentially of, consists of a polyalphaolefin comprising a mixture of any of the polymers in the preceding sentences. The method and/or system of any sentence of any previous paragraph, wherein the oleaginous heat transfer fluid comprises, consists essentially of, consists a polyalphaolefin of mixtures of C6 and C8 α-olefins. The method and/or system of any sentence of any previous paragraph, wherein the oleaginous heat transfer fluid comprises, consists essentially of, consists of a polyalphaolefin of mixtures of C6 and C10 α-olefin. The method and/or system of any sentence of any previous paragraph, wherein the oleaginous heat transfer fluid comprises, consists essentially of, consists of a polyalphaolefin of mixtures of C6 and C12 α-olefin. The method and/or system of any sentence of any previous paragraph, wherein the oleaginous heat transfer fluid comprises, consists essentially of, consists of a polyalphaolefin of mixtures of C6 and C14 α-olefin. The method and/or system of any sentence of any previous paragraph, wherein the oleaginous heat transfer fluid comprises, consists essentially of, consists of a polyalphaolefin of mixtures of C6 and C16 α-olefin. The method and/or system of any sentence of any previous paragraph, wherein the oleaginous heat transfer fluid comprises, consists essentially of, consists of a polyalphaolefin of mixtures of C6, C8 and C10 α-olefin. The method and/or system of any sentence of any previous paragraph, wherein the oleaginous heat transfer fluid comprises, consists essentially of, consists of a polyalphaolefin of mixtures of C6, C8 and C12 α-olefin. The method and/or system of any sentence of any previous paragraph, wherein the oleaginous heat transfer fluid comprises, consists essentially of, consists of a polyalphaolefin of mixtures of C6, C8 and C14 α-olefin. The method and/or system of any sentence of any previous paragraph, wherein the oleaginous heat transfer fluid comprises, consists essentially of, consists of a polyalphaolefin of mixtures of C6, C8 and C16 α-olefin. The method and/or system of any sentence of any previous paragraph, wherein the oleaginous heat transfer fluid comprises, consists essentially of, consists of a polyalphaolefin of mixtures of C8 and C10 α-olefin. The method and/or system of any sentence of any previous paragraph, wherein the oleaginous heat transfer fluid comprises, consists essentially of, consists of a polyalphaolefin of mixtures of C8 and C12 α-olefin. The method and/or system of any sentence of any previous paragraph, wherein the oleaginous heat transfer fluid comprises, consists essentially of, consists of a polyalphaolefin of mixtures of C8 and C14 α-olefin. The method and/or system of any sentence of any previous paragraph, wherein the oleaginous heat transfer fluid comprises, consists essentially of, consists of a polyalphaolefin of mixtures of C8 and C16 α-olefin. The method and/or system of any sentence of any previous paragraph, wherein the oleaginous heat transfer fluid comprises, consists essentially of, consists of a polyalphaolefin of mixtures of C8, C10 and C12 α-olefin. The method and/or system of any sentence of any previous paragraph, wherein the oleaginous heat transfer fluid comprises, consists essentially of, consists of a polyalphaolefin of mixtures of C8, C10 and C14 α-olefin. The method and/or system of any sentence of any previous paragraph, wherein the oleaginous heat transfer fluid comprises, consists essentially of, consists of a polyalphaolefin of mixtures of C8, C10 and C16 α-olefin. The method and/or system of any sentence of any previous paragraph, wherein the oleaginous heat transfer fluid comprises, consists essentially of, consists of a polyalphaolefin of mixtures of C10 and C12 α-olefin. The method and/or system of any sentence of any previous paragraph, wherein the oleaginous heat transfer fluid comprises, consists essentially of, consists of a polyalphaolefin of mixtures of C10 and C14 α-olefin. The method and/or system of any sentence of any previous paragraph, wherein the oleaginous heat transfer fluid comprises, consists essentially of, consists of a polyalphaolefin of mixtures of C10 and C16 α-olefin. The method and/or system of any sentence of any previous paragraph, wherein the oleaginous heat transfer fluid comprises, consists essentially of, consists of a polyalphaolefin of mixtures of C10, C12 and C14 α-olefin. The method and/or system of any sentence of any previous paragraph, wherein the oleaginous heat transfer fluid comprises, consists essentially of, consists of a polyalphaolefin of mixtures of C10, C12 and C16 α-olefin.

The method and/or system of any sentence of any previous paragraph, wherein the oleaginous heat transfer fluid is substantially free, or free, of cyclic structures. The method and/or system of any sentence of any previous paragraph, wherein the oleaginous heat transfer fluid comprises an isoparaffinic oil containing at least one saturated hydrocarbon compound having from 8 to 50 carbon atoms. The method and/or system of any sentence of any previous paragraph, wherein the oleaginous heat transfer fluid comprises an isoparaffinic oil containing at least one saturated hydrocarbon compound having at least 10 carbon atoms. The method and/or system of any sentence of any previous paragraph, wherein the oleaginous heat transfer fluid comprises an isoparaffinic oil containing at least one saturated hydrocarbon compound having at least 12 carbon atoms. The method and/or system of any sentence of any previous paragraph, wherein the oleaginous heat transfer fluid comprises an isoparaffinic oil containing at least one saturated hydrocarbon compound having from 14 to 34 carbon atoms. The method and/or system of any sentence of any previous paragraph, wherein the oleaginous heat transfer fluid comprises an isoparaffinic oil having at least one hydrocarbyl branch, and has a single continuous carbon chain of no more than 24 carbon atoms. The method and/or system of any sentence of any previous paragraph, wherein the at least one saturated hydrocarbon compound comprises a branched acyclic compound with a molecular weight of 140 g/mol to 550 g/mol. The method and/or system of any sentence of any previous paragraph, wherein the at least one saturated hydrocarbon compound comprises a branched acyclic compound with a molecular weight of 160 g/mol to 480 g/mol.

The method and/or system of any sentence of any previous paragraph, wherein the oleaginous heat transfer fluid comprises, consists essentially of, consists of an ester oil. The method and/or system of any sentence of any previous paragraph, wherein the oleaginous heat transfer fluid comprises, consists essentially of, consists of esters of monocarboxylic acids with monohydric alcohols. The method and/or system of any sentence of any previous paragraph, wherein the oleaginous heat transfer fluid comprises, consists essentially of, consists of di-esters of diols with monocarboxylic acids. The method and/or system of any sentence of any previous paragraph, wherein the oleaginous heat transfer fluid comprises, consists essentially of, consists of di-esters of dicarboxylic acids with monohydric alcohols. The method and/or system of any sentence of any previous paragraph, wherein the oleaginous heat transfer fluid comprises, consists essentially of, consists of polyol esters of monocarboxylic acids. The method and/or system of any sentence of any previous paragraph, wherein the oleaginous heat transfer fluid comprises, consists essentially of, consists of esters of neopentanoic acid. The method and/or system of any sentence of any previous paragraph, wherein the oleaginous heat transfer fluid comprises, consists essentially of, consists of esters of 2-ethylhexanoic acid. The method and/or system of any sentence of any previous paragraph, wherein the oleaginous heat transfer fluid comprises, consists essentially of, consists of polyesters of monohydric alcohols with polycarboxylic acids. The method and/or system of any sentence of any previous paragraph, wherein the oleaginous heat transfer fluid comprises, consists essentially of, consists of esters of phthalic acid. The method and/or system of any sentence of any previous paragraph, wherein the oleaginous heat transfer fluid comprises, consists essentially of, consists of esters of succinic acid. The method and/or system of any sentence of any previous paragraph, wherein the oleaginous heat transfer fluid comprises, consists essentially of, consists of esters of alkyl succinic acid. The method and/or system of any sentence of any previous paragraph, wherein the oleaginous heat transfer fluid comprises, consists essentially of, consists of esters of alkenyl succinic acids. The method and/or system of any sentence of any previous paragraph, wherein the oleaginous heat transfer fluid comprises, consists essentially of, consists of esters of maleic acid. The method and/or system of any sentence of any previous paragraph, wherein the oleaginous heat transfer fluid comprises, consists essentially of, consists of esters of azelaic acid. The method and/or system of any sentence of any previous paragraph, wherein the oleaginous heat transfer fluid comprises, consists essentially of, consists of esters of suberic acid. The method and/or system of any sentence of any previous paragraph, wherein the oleaginous heat transfer fluid comprises, consists essentially of, consists of esters of sebacic acid. The method and/or system of any sentence of any previous paragraph, wherein the oleaginous heat transfer fluid comprises, consists essentially of, consists of esters of fumaric acid. The method and/or system of any sentence of any previous paragraph, wherein the oleaginous heat transfer fluid comprises, consists essentially of, consists of esters of adipic acid. The method and/or system of any sentence of any previous paragraph, wherein the oleaginous heat transfer fluid comprises, consists essentially of, consists of esters of linoleic acid dimer. The method and/or system of any sentence of any previous paragraph, wherein the oleaginous heat transfer fluid comprises, consists essentially of, consists of esters of malonic acid. The method and/or system of any sentence of any previous paragraph, wherein the oleaginous heat transfer fluid comprises, consists essentially of, consists of esters of alkyl malonic acids. The method and/or system of any sentence of any previous paragraph, wherein the oleaginous heat transfer fluid comprises, consists essentially of, consists of esters of alkenyl malonic acids. The method and/or system of any sentence of any previous paragraph, wherein the oleaginous heat transfer fluid comprises, consists essentially of, consists of esters of butyl alcohol. The method and/or system of any sentence of any previous paragraph, wherein the oleaginous heat transfer fluid comprises, consists essentially of, consists of esters of hexyl alcohol. The method and/or system of any sentence of any pre-vious paragraph, wherein the oleaginous heat transfer fluid comprises, consists essentially of, consists of esters of dodecyl alcohol. The method and/or system of any sentence of any previous paragraph, wherein the oleaginous heat transfer fluid comprises, consists essentially of, consists of esters of 2-ethylhexyl alcohol. The method and/or system of any sentence of any previous paragraph, wherein the oleaginous heat transfer fluid comprises, consists essentially of, consists of esters of ethylene glycol. The method and/or system of any sentence of any previous paragraph, wherein the oleaginous heat transfer fluid comprises, consists essentially of, consists of esters of diethylene glycol. The method and/or system of any sentence of any previous paragraph, wherein the oleaginous heat transfer fluid comprises, consists essentially of, consists of esters of monoether. The method and/or system of any sentence of any previous paragraph, wherein the oleaginous heat transfer fluid comprises, consists essentially of, consists of esters of propylene glycol. The method and/or system of any sentence of any previous paragraph, wherein the oleaginous heat transfer fluid comprises, consists essentially of, consists of esters of pentyl alcohol. The method and/or system of any sentence of any previous paragraph, wherein the oleaginous heat transfer fluid comprises, consists essentially of, consists of esters of neopentyl alcohol. The method and/or system of any sentence of any previous paragraph, wherein the oleaginous heat transfer fluid comprises, consists essentially of, consists of esters of octyl alcohol. The method and/or system of any sentence of any previous paragraph, wherein the oleaginous heat transfer fluid comprises, consists essentially of, consists of esters of iso-octyl alcohol. The method and/or system of any sentence of any previous paragraph, wherein the oleaginous heat transfer fluid comprises, consists essentially of, consists of esters of nonyl alcohol. The method and/or system of any sentence of any previous paragraph, wherein the oleaginous heat transfer fluid comprises, consists essentially of, consists of esters of decyl alcohol. The method and/or system of any sentence of any previous paragraph, wherein the oleaginous heat transfer fluid comprises, consists essentially of, consists of esters of isodecyl alcohol. The method and/or system of any sentence of any previous paragraph, wherein the oleaginous heat transfer fluid comprises, consists essentially of, consists of esters of dodecyl alcohol. The method and/or system of any sentence of any previous paragraph, wherein the oleaginous heat transfer fluid comprises, consists essentially of, consists of esters of tetradecyl alcohol. The method and/or system of any sentence of any previous paragraph, wherein the oleaginous heat transfer fluid comprises, consists essentially of, consists of esters of hexadecyl alcohol. The method and/or system of any sentence of any previous paragraph, wherein the oleaginous heat transfer fluid comprises, consists essentially of, consists of esters of dibutyl adipate. The method and/or system of any sentence of any previous paragraph, wherein the oleaginous heat transfer fluid comprises, consists essentially of, consists of esters of di(2-ethylhexyl) sebacate. The method and/or system of any sentence of any previous paragraph, wherein the oleaginous heat transfer fluid comprises, consists essentially of, consists of esters of di-n-hexyl fumarate. The method and/or system of any sentence of any previous paragraph, wherein the oleaginous heat transfer fluid comprises, consists essentially of, consists of esters of dioctyl sebacate. The method and/or system of any sentence of any previous paragraph, wherein the oleaginous heat transfer fluid comprises, consists essentially of, consists of esters of diisooctyl azelate. The method and/or system of any sentence of any previous paragraph, wherein the oleaginous heat transfer fluid comprises, consists essentially of, consists of esters of diisodecyl azelate. The method and/or system of any sentence of any previous paragraph, wherein the oleaginous heat transfer fluid comprises, consists essentially of, consists of esters of dioctyl phthalate. The method and/or system of any sentence of any previous paragraph, wherein the oleaginous heat transfer fluid comprises, consists essentially of, consists of esters of didecyl phthalate. The method and/or system of any sentence of any previous paragraph, wherein the oleaginous heat transfer fluid comprises, consists essentially of, consists of esters of dieicosyl sebacate. The method and/or system of any sentence of any previous paragraph, wherein the oleaginous heat transfer fluid comprises, consists essentially of, consists of esters of the 2-ethylhexyl diester of linoleic acid dimer. The method and/or system of any sentence of any previous paragraph, wherein the oleaginous heat transfer fluid comprises, consists essentially of, consists of esters of the complex ester formed by reacting one mole of sebacic acid with two moles of tetraethylene glycol and two moles of 2-ethylhexanoic acid. The method and/or system of any sentence of any previous paragraph, wherein the oleaginous heat transfer fluid comprises, consists essentially of, consists of esters of triglycerides.

The method and/or system of any sentence of any previous paragraph, wherein the oleaginous heat transfer fluid comprises, consists essentially of, consists of alkylated aromatic oils. The method and/or system of any sentence of any previous paragraph, wherein the oleaginous heat transfer fluid comprises, consists essentially of, consists of alkylated napthalene. The method and/or system of any sentence of any previous paragraph, wherein the oleaginous heat transfer fluid comprises, consists essentially of, consists of low viscosity naphthenic mineral oils. The method and/or system of any sentence of any previous paragraph, wherein the oleaginous heat transfer fluid comprises, consists essentially of, consists of (poly)ether oils. The method and/or system of any sentence of any previous paragraph, wherein the oleaginous heat transfer fluid comprises, consists essentially of, consists of alkylene oxide polymers. The method and/or system of any sentence of any previous paragraph, wherein the oleaginous heat transfer fluid comprises, consists essentially of, consists of alkylene oxide interpolymers. The method and/or system of any sentence of any previous paragraph, wherein the oleaginous heat transfer fluid comprises, consists essentially of, consists of diethylene glycol dibutyl ether.

What is claimed is:

1. A method of cooling electrical componentry comprising immersing the electrical componentry in a bath comprising a dielectric heat transfer fluid consisting of an isoparaffinic oil containing at least one saturated hydrocarbon compound having from 8 to 50 carbon atoms and having a kinematic viscosity measured at 100° C. of 0.7 to 7.0 cSt as measured according to ASTM D445_100, and a flash point of at least 50° C. as measured according to ASTM D56, and up to 3 weight percent of one or more additional additives, and operating the electrical componentry.

2. The method of claim 1, wherein the electrical componentry comprises a battery.

3. The method of claim 2, wherein the battery operates an electric vehicle.

4. The method of claim 1, wherein the electrical componentry comprises at least one of aircraft electronics, computer electronics, invertors, DC to DC convertors, chargers, invertors, electric motors, and electric motor controllers.

5. The method of claim 1, wherein the dielectric heat transfer fluid has a dielectric constant of 5.0 or lower as measured according to ASTM D924.

6. The method of claim 1 wherein the heat transfer fluid has a flash point of at least at least 75° C.

7. The method of claim 1, wherein the heat transfer fluid has a pour point of at least −30° C. as measured according to ASTM D5985.

8. The method of claim 1, wherein the heat transfer fluid has an absolute viscosity of no more than 900 cP at −30° C. as measured according to ASTM D2983 at −30° C.

9. The method of claim 1, wherein the heat transfer fluid is substantially free, or free, of cyclic structures.

10. The method of claim 1, wherein the at least one saturated hydrocarbon compound contains at least 10 carbon atoms and at least one hydrocarbyl branch, and has a single continuous carbon chain of no more than 24 carbon atoms.

11. The method of claim 1, wherein the at least one saturated hydrocarbon compound comprises a branched acyclic compound with a molecular weight of 140 g/mol to 550 g/mol.

12. An immersion coolant system for an electric vehicle comprising a battery pack situated in a bath, wherein the bath is in fluid communication with a heat transfer fluid reservoir comprising a dielectric heat transfer fluid consisting of an isoparaffinic oil containing at least one saturated hydrocarbon compound having from 8 to 50 carbon atoms and having a kinematic viscosity measured at 100° C. of 0.7 to 7.0 cSt and a flash point of at least 50° C. and up to 3 weight percent of one or more additional additives.

13. The immersion coolant system of claim 12, wherein the dielectric heat transfer fluid has a dielectric constant of 1.9 or greater as measured according to ASTM D924.

14. The immersion coolant system of claim 12 wherein the heat transfer fluid has a flash point of at least 60° C., or at least 75° C., or at least 100° C.

15. The immersion coolant system of claim 12, wherein the heat transfer fluid is substantially free, or free, of cyclic structures.

16. The immersion coolant system of claim 12, wherein the at least one saturated hydrocarbon compound contains at least 10 carbon atoms and at least one hydrocarbyl branch, and has a single continuous carbon chain of no more than 24 carbon atoms.

* * * * *